US009997980B2

(12) United States Patent
Tsuboi

(10) Patent No.: US 9,997,980 B2
(45) Date of Patent: Jun. 12, 2018

(54) RECEIVING MEMBER AND DRIVE APPARATUS INCLUDING THE SAME

(71) Applicant: DENSO CORPORATION, Kariya, Aichi-pref. (JP)

(72) Inventor: Takashi Tsuboi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 233 days.

(21) Appl. No.: 14/956,163

(22) Filed: Dec. 1, 2015

(65) Prior Publication Data

US 2016/0165736 A1    Jun. 9, 2016

(30) Foreign Application Priority Data

Dec. 3, 2014   (JP) ................. 2014-245059

(51) Int. Cl.
*H02K 11/00*  (2016.01)
*H02K 5/22*   (2006.01)
*H02K 11/33*  (2016.01)
*H05K 7/20*   (2006.01)

(52) U.S. Cl.
CPC ............... *H02K 11/33* (2016.01); *H02K 5/22* (2013.01); *H05K 7/20854* (2013.01)

(58) Field of Classification Search
CPC .......... H02K 5/132; H02K 5/22; H02K 5/225; H02K 5/10; H02K 5/12; H02K 11/00–11/40
USPC .................................. 310/86–89, 68 A–68 R
See application file for complete search history.

(56) References Cited

U.S. PATENT DOCUMENTS

| 2005/0012415 A1* | 1/2005 | Hatano ................... F16K 31/04 310/80 |
| 2012/0314420 A1 | 12/2012 | Yamamoto et al. |
| 2013/0320792 A1* | 12/2013 | Fukasaku ................. H02K 5/22 310/89 |

FOREIGN PATENT DOCUMENTS

| JP | 07237267 A | * | 9/1995 | ............. B29C 65/48 |
| JP | H07-237267 | | 9/1995 | |
| JP | 09215252 A | * | 8/1997 | ............. B29C 65/48 |
| JP | 2000-206137 | | 7/2000 | |
| JP | 2000206137 A | * | 7/2000 | |
| JP | 2005-327954 | | 11/2005 | |
| JP | 2005327954 A | * | 11/2005 | |

(Continued)

OTHER PUBLICATIONS

Machine Translation, Sekido et al., JP 2000206137 A, Jul. 28, 2000.*

(Continued)

*Primary Examiner* — Thomas Truong
(74) *Attorney, Agent, or Firm* — Knobbe, Martens, Olson & Bear, LLP

(57) ABSTRACT

A connector case of a receiving member includes a peripheral wall portion, in which a seal groove is formed. An inserting portion of a cover member projects from a cover main body toward the connector case and is inserted into the seal groove. Positioning portions project from the cover main body toward the connector case on a side of the inserting portion where a receiving space is placed. Furthermore, a distal end of an inner wall portion of the seal groove is placed on a top side of a distal end of an outer wall portion. A distal end of the positioning portion is placed on a base side of a distal end of the inserting portion.

6 Claims, 11 Drawing Sheets

(56) References Cited

FOREIGN PATENT DOCUMENTS

JP      2014-086644         5/2014
JP      2014-187728 A       10/2014

OTHER PUBLICATIONS

Machine Translation, Tokuhara et al., JP 07237267 A, Sep. 12, 1995.*
Machine Translation, Konishi, JP 2005327954 A, Nov. 24, 2005.*

* cited by examiner

RECEIVING MEMBER AND DRIVE APPARATUS INCLUDING THE SAME

CROSS REFERENCE TO RELATED APPLICATION

This application is based on and incorporates herein by reference Japanese Patent Application No. 2014-245059 filed on Dec. 3, 2014.

TECHNICAL FIELD

The present disclosure relates to a receiving member and a drive apparatus including the same.

BACKGROUND

Previously, an electronic control device, which includes a case and a cover for receiving a circuit board, is known. For example, in JP2014-187728A, a seal groove is formed in a distal end of a peripheral wall of a case, and a seal material is filled in the seal groove. A projecting portion of a cover is inserted into the seal groove to seal between the cover and the case.

In JP2014-187728A, in a case where two wall portions, which are located on two opposite sides, respectively, of the seal groove, have an identical height, when the projecting portion of the cover is inserted into the seal groove in a state where the seal material is filled in the seal groove, the seal material may possibly intrude into an inside of the case.

SUMMARY

The present disclosure is made in view of the above point. According to the present disclosure, there is provided a receiving member that includes a case member and a cover member. The case member includes a peripheral wall portion. A seal groove, which is filled with a seal material, is formed in the peripheral wall portion, and a receiving space, which receives a protection-subject component, is formed in an inside of the case member. The cover member includes a cover main body, an inserting portion and a positioning portion. The cover main body covers the protection-subject component. The inserting portion projects from the cover main body toward the case member and is inserted into the seal groove. The positioning portion projects from the cover man body toward the case member and is located on a side of the inserting portion where the receiving space is placed. The positioning portion has a surface that is located on a side where the inserting portion is placed, and the surface of the positioning portion contacts a surface of the peripheral wall portion located on a side where the receiving space is placed. One side, at which the cover member is placed along an inserting direction of the inserting portion relative to the seal groove, is defined as a top side. Another side, at which the case member is placed along the inserting direction, is defined as a base side. A wall portion of the seal groove, which is located on a side where the receiving space is placed, is an inner wall portion. A wall portion of the seal groove, which is located on an opposite side that is opposite from the receiving space, is an outer wall portion. A distal end of the inner wall portion is placed on the top side of a distal end of the outer wall portion. A distal end of the positioning portion is placed on the base side of a distal end of the inserting portion.

According to the present disclosure, there is also provided a drive apparatus that includes the receiving member, the protection-subject component and an electrical rotating machine. The protection-subject component is a control unit that includes an electronic component, which is involved in a control operation of the electrical rotating machine.

BRIEF DESCRIPTION OF THE DRAWINGS

The drawings described herein are for illustration purposes only and are not intended to limit the scope of the present disclosure in any way.

DETAILED DESCRIPTION

Figure 1:
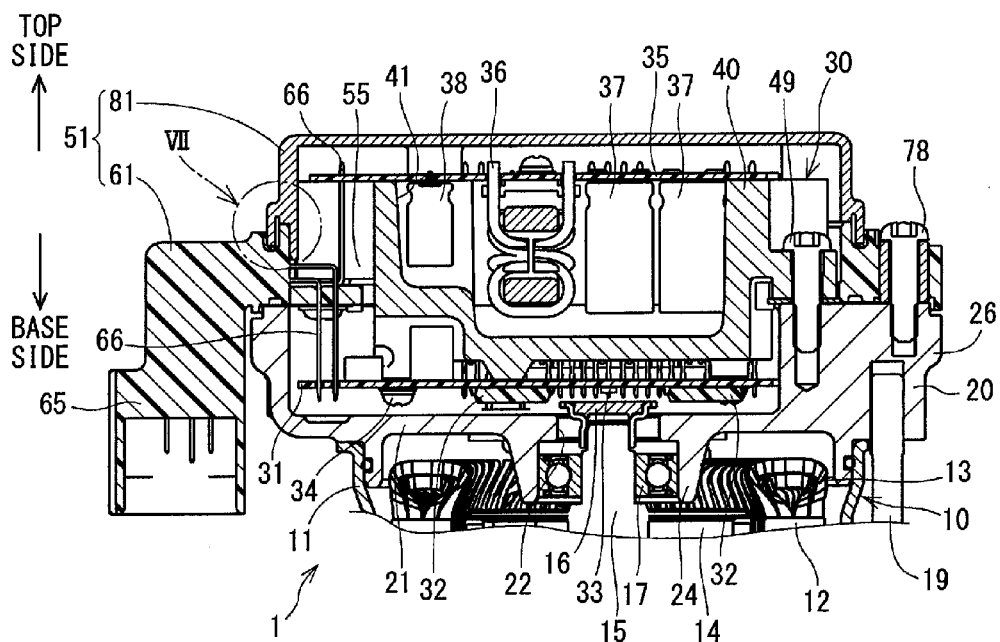
FIG. 1 is a cross-sectional view of a drive apparatus according to a first embodiment of the present invention.

Various embodiments of a receiving member and a drive apparatus including the receiving member according to the present disclosure will be described with reference to the accompanying drawings. In the following embodiments, similar components will be indicated by the same reference numerals and will not be described redundantly for the sake of simplicity.

First Embodiment

A first embodiment of the present disclosure will be described with reference to FIGS. 1 to 8.

Figure 2:
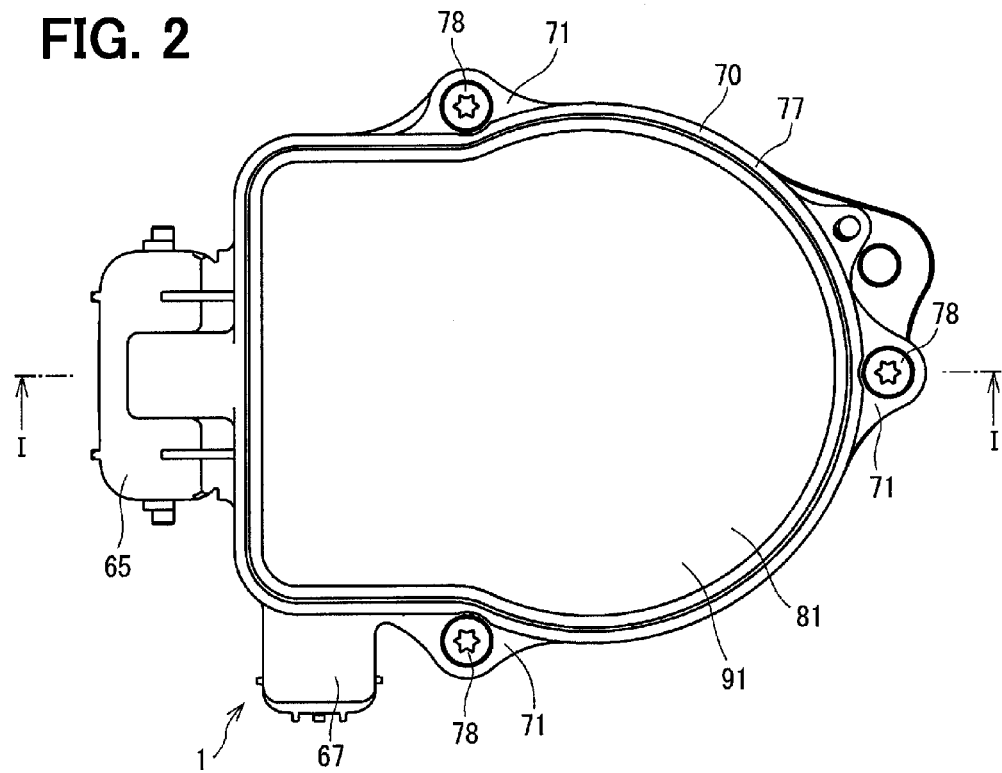
FIG. 2 is a plan view of the drive apparatus according to the first embodiment.

As shown in FIGS. 1 and 2, a receiving member 51 of the present disclosure is applied to a drive apparatus 1. The drive apparatus 1 is applied to, for example, an electric power steering apparatus. FIG. 1 is a cross-sectional view taken along line I-I in FIG. 2.

As shown in FIG. 1, the drive apparatus 1 includes an electric motor (serving as an electrical rotating machine) 10, a control unit (serving as a protection-subject component that is a component to be protected) 30, and the receiving member 51. The drive apparatus 1 is an electromechanical drive apparatus, in which the control unit 30 is placed at one side in the axial direction of the motor 10 (an opposite side from an output end of the motor 10).

The motor 10 includes a motor case 11, a stator 12, a rotor 14, a shaft 15, a front frame end (not shown) and a rear frame end 20. The motor 10 is a three-phase brushless motor. The control unit 30 controls an operation of the motor 10.

The motor case 11 is configured into a generally cylindrical tubular form and is made of, for example, metal. The stator 12, around which windings 13 are wound, is fixed in an inside of the motor case 11. The windings 13 form three-phase windings, which include a U-phase coil, a V-phase coil and a W-phase coil. The windings 13 include two sets of three-phase windings. When the windings 13 are energized, the motor 10 is driven to rotate. The windings 13 are connected to motor lines (not shown). Opposite ends of the motor lines, which are opposite from the windings 13, are inserted into motor wire receiving holes formed in the rear frame end 20 and are extended to the control unit 30 side where the opposite ends of the motor lines are connected to a power circuit board 35.

The rotor 14 is rotatably placed on a radially inner side of the stator 12. The shaft 15 is configured into a rod form and is made of, for example, metal. The shaft 15 is fixed to a central axis of the rotor 14, which is configured into a generally cylindrical tubular form. In this way, the shaft 15 is rotated integrally with the rotor 14. In the present embodiment, the axial direction of the shaft 15 will be simply referred to as "an axial direction", and a direction perpendicular to the axis of the shaft 15 will be simply referred to as "a radial direction." These definitions will be also applied to the control unit 30 and the receiving member 51.

A magnet 16 is fixed to an end part of the shaft 15, which is axially located on a side where the control unit 30 is placed. The magnet 16 is axially exposed to the control unit 30 side from a through-hole 22 formed at a center of the rear frame end 20. The magnet 16 is used to sense a rotational angle of the rotor 14.

The front frame end is placed to close an end part of the motor case 11, which is axially located on a side that is opposite from the control unit 30. The rear frame end 20 is placed to close an end part of the motor case 11, which is axially located on a side where the control unit 30 is placed. The front frame end and the rear frame end 20 are fixed together by through bolts 19 in a state where the motor case 11 is clamped between the front frame end and the rear frame end 20.

The rear frame end 20 is configured into a generally tubular form having a bottom. The rear frame end 20 includes a bottom portion 21 and a peripheral wall portion 26. The through-hole 22, through which the shaft 15 is received, is formed in a center of the bottom portion 21, and the magnet 16 is axially exposed from the through-hole 22 on the control unit 30 side. A bearing holding portion 24, which holds a bearing 17 for rotatably supporting the shaft 15, is formed in the center of the bottom portion 21.

A heat sink 40 and a connector case (serving as a case member) 61 are fixed to the peripheral wall portion 26.

The control unit 30 includes a control circuit board 31, the power circuit board 35, the heat sink 40 and power modules (not shown).

The control circuit board 31 is fixed to the motor 10 side of the heat sink 40 with fixing members 34, such as screws. Control electronic components 32, such as a microcomputer and a pre-driver, are installed to the control circuit board 31. The heat, which is generated from the control electronic components 32, is released to the heat sink 40 through the fixing members 34.

A rotational angle sensor 33, which senses a rotational position of the rotor 14, is installed to a corresponding location of the control circuit board 31, which is opposed to the magnet 16.

The power circuit board 35 is fixed to the opposite side of the heat sink 40, which is axially opposite from the motor 10, with, for example, screws. Power electronic components, such as a choke coil 36 and capacitors 37, 38, to which a relatively large electric power is supplied, are installed to the power circuit board 35.

The heat sink 40 is made of a heat conductive material, such as aluminum, which has the relatively high heat conductivity. The heat sink 40 holds the control circuit board 31, the power circuit board 35 and the power modules. A receiving chamber 41, which axially opens to the power circuit board 35 side, is formed in the heat sink 40. The receiving chamber 41 receives the choke coil 36 and the capacitors 37, 38, which are installed to the power circuit board 35 on the axial side where the heat sink 40 is placed.

Each of the power modules includes switching elements for switching the energization of the windings 13 of the corresponding set. The power module is installed such that the heat can be released from the power module to the heat sink 40, and the power module is connected to the power circuit board 35. In the present embodiment, the control electronic components 32, the choke coil 36, the capacitors 37, 38 and the power modules serve as the electronic components of the present disclosure.

The heat sink 40 is fixed to the rear frame end 20 with fixing members 49, such as screws, in the state where the control circuit board 31, the power circuit board 35 and the power modules are fixed to the heat sink 40.

The receiving member 51 includes the connector case 61 and a cover member 81. In the present embodiment, the cover member 81 is placed on one side of the connector case 61 in the axial direction. When an inserting portion 92 of the cover member 81 is inserted into a seal groove 75 described later, the connector case 61 and the cover member 81 are assembled together. Here, one side, at which the cover member 81 is placed along an inserting direction of the inserting portion 92 relative to the seal groove 75 (or along a direction parallel to the inserting direction), is defined as a top side. Furthermore, another side, at which the connector case 61 is placed along the inserting direction of the inserting portion 92 relative to the seal groove 75 (or along the direction parallel to the inserting direction), is defined as a base side. In the present embodiment, the inserting direction generally coincides with the axial direction.

Figure 3:
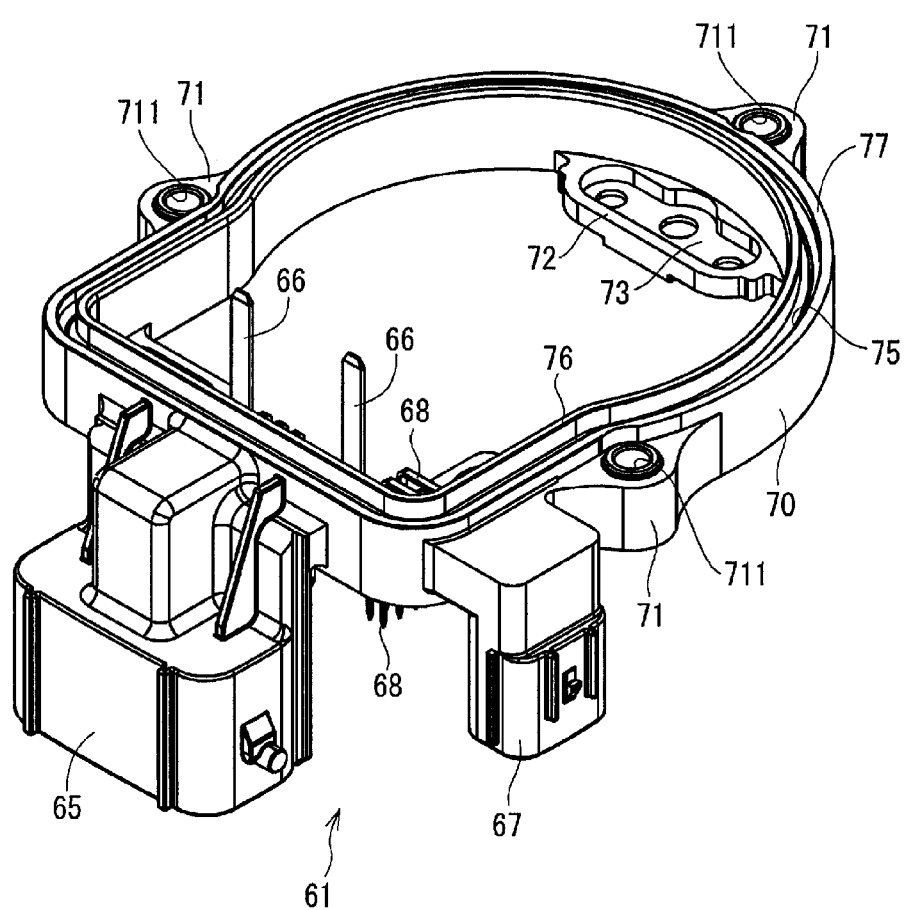
FIG. 3 is a perspective view of a connector case according to the first embodiment.
Figure 4:
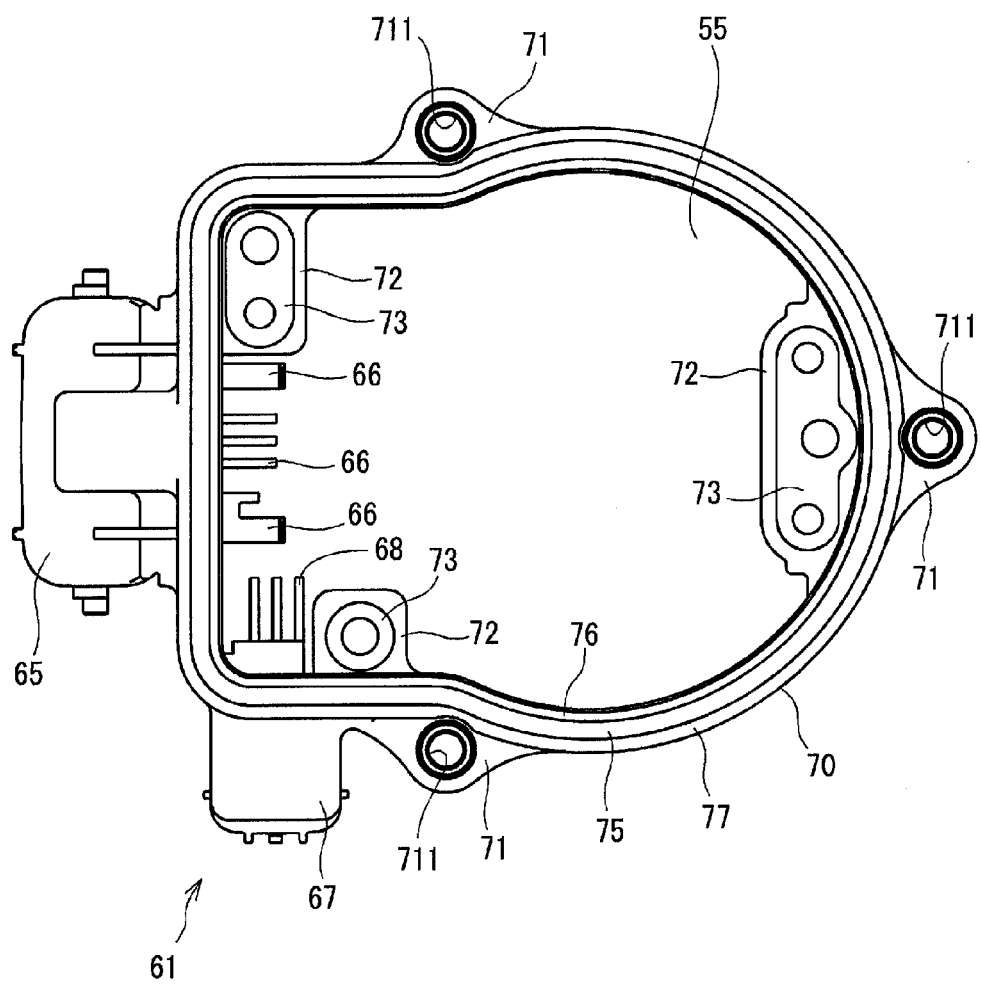
FIG. 4 is a plan view of the connector case according to the first embodiment.

As shown in FIGS. 1, 3, 4, and 7, the connector case 61 includes a first connector 65, a second connector 67 and a peripheral wall portion 70 and is fixed to the rear frame end 20 with fixing members 78, such as screws. An O-ring (not shown) is placed in a contact location, at which the connector case 61 and the rear frame end 20 contact with each other. In this way, intrusion of, for example, water into the inside through a gap between the connector case 61 and the rear frame end 20 is limited. FIGS. 3 and 4 indicate a side of the connector case 61, which is opposed to the cover member 81.

The first connector 65 and the second connector 67 radially outwardly project from the peripheral wall portion 70 and are formed integrally with the peripheral wall portion 70 (i.e., are formed integrally and seamlessly with the peripheral wall portion 70 as a one-piece body). The first connector 65 includes terminals 66, each of which is connected to the control circuit board 31 or the power circuit board 35. The first connector 65 is used to connect an electric power source and a controller area network (CAN) to the circuit boards 31, 35. The second connector 67 includes terminals 68, each of which is connected to the control circuit board 31 or the power circuit board 35. A torque sensor, which senses a steering torque inputted at the time of operating a steering wheel (not shown) of a vehicle by a driver of the vehicle, is connected to the circuit boards 31, 35 by the second connector 67. In the present embodiment, the first connector 65 and the second connector 67 serve as connectors of the present disclosure. Furthermore, the electric power source, the CAN and the torque sensor serve as external devices of the present disclosure.

The peripheral wall portion 70 is configured into a tubular form. The cover member 81 is fixed to an end part of the peripheral wall portion 70, which is axially located on the side that is opposite from the motor 10. A receiving space 55 is formed on an inner side (a radially inner side in the present embodiment) of the peripheral wall portion 70. In the present embodiment, the receiving space 55 is a space that is defined by the connector case 61, the cover member 81 and the rear frame end 20. The control unit 30 is placed in the receiving space 55.

Fixing portions 71 radially outwardly project from the peripheral wall portion 70. A through-hole 711, through which the corresponding fixing member 78 is inserted, is formed in each of the fixing portions 71.

In the connector case 61, plate holding portions 72, into each of which a corresponding one of plates 73 is fitted, are formed on a radially inner side of the peripheral wall portion 70. Each plate 73 is made of metal, such as copper, which has the high heat conductivity and has the relatively high strength. One surface of the plate 73 contacts the rear frame end 20, and the other surface of the plate 73, which is opposite from the one surface, contacts the heat sink 40. One or more through-holes are formed in each plate 73 to receive each corresponding screw fixed to the rear frame end 20 or the heat sink 40. In the present embodiment, the number of the plates 73 is three, and these plates 73 have different shapes, respectively.

In the present embodiment, the heat sink 40 and the rear frame end 20 contact with each other through the plates 73. In this way, the heat of the heat sink 40 can be released to the outside through the plates 73 and the rear frame end 20, so that the heat release efficiency is improved.

The seal groove 75 is formed in the peripheral wall portion 70 on the axial side, which is opposite from the motor 10, i.e., on the top side at a location, which is on the radially inner side of the fixing portions 71. The seal groove 75 opens on the top side and is continuously formed all around along the entire circumferential extent of the peripheral wall portion 70. A seal material 59, such as silicone bonding agent, is filled into the seal groove 75.

As long as the seal groove 75 is continuously formed, it is not required to extend the seal groove 75 along a single plane (e.g., a plane perpendicular to the axial direction). That is, for instance, at least a portion of the seal groove 75 may be tilted in the axial direction depending on the locations of the other members. For example, the connector 65 side of the seal groove 75 may be placed at a higher location in the axial direction, and the opposite side of the seal groove 75, which is opposite from the connector 65, may be placed at a lower location, which is lower than the higher location in the axial direction.

Figure 7:
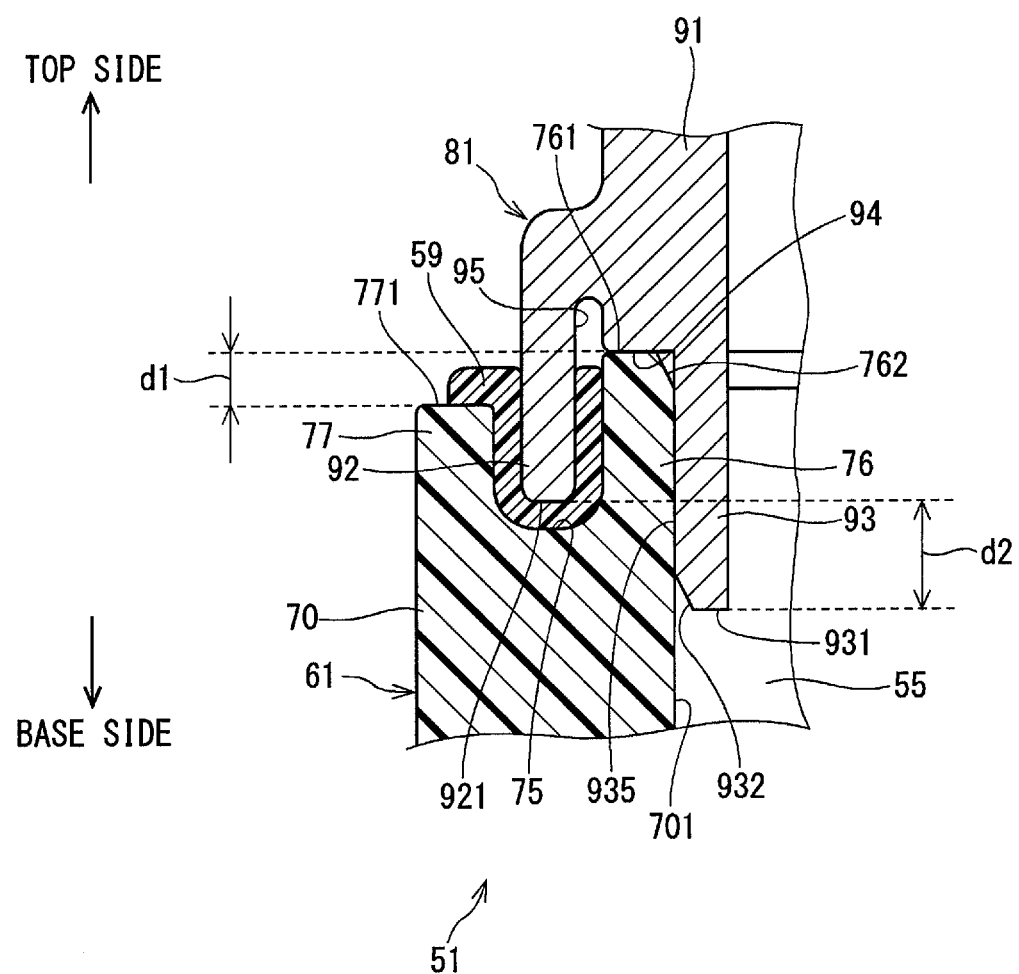
FIG. 7 is a partial enlarged view of an area VII in FIG. 1.

In the present embodiment, a wall portion of the seal groove 75, which is located on a side (radially inner side) where the receiving space 55 is placed, is an inner wall portion 76. Furthermore, a wall portion of the seal groove 75, which is located on an opposite side (radially outer side) that is opposite from the receiving space 55 in the radial direction, is an outer wall portion 77. As shown in FIG. 7, a height of the inner wall portion 76 measured in the axial direction is larger than a height of the outer wall portion 77 measured in the axial direction. That is, a distal end 761 of the inner wall portion 76 is axially displaced from a distal end 771 of the outer wall portion 77 on the top side by a height difference (or simply referred to as a height) d1.

Furthermore, a radially inner side of the distal end 761 of the inner wall portion 76 is cut to form a tapered surface 762.

Figure 5:
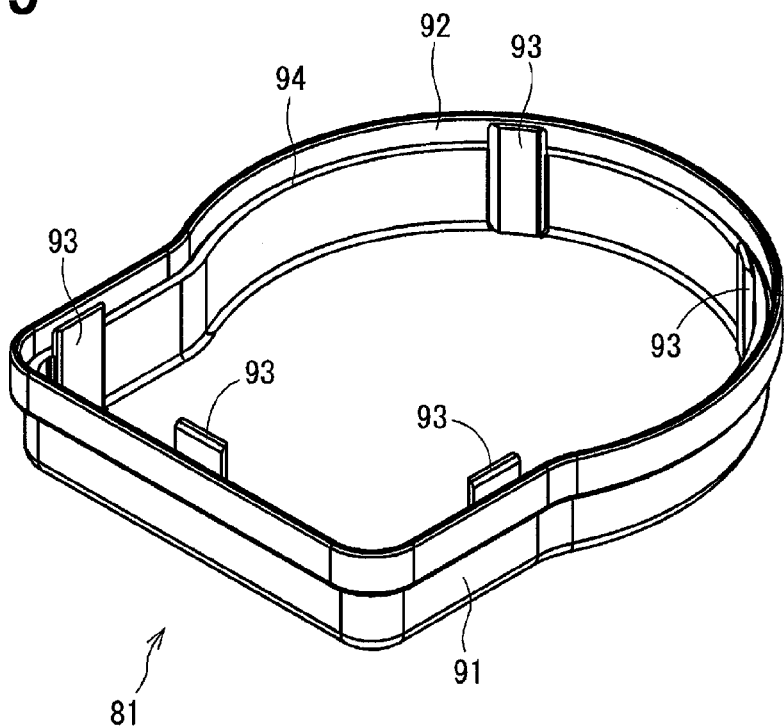
FIG. 5 is a perspective view of a cover member according to the first embodiment.
Figure 6:
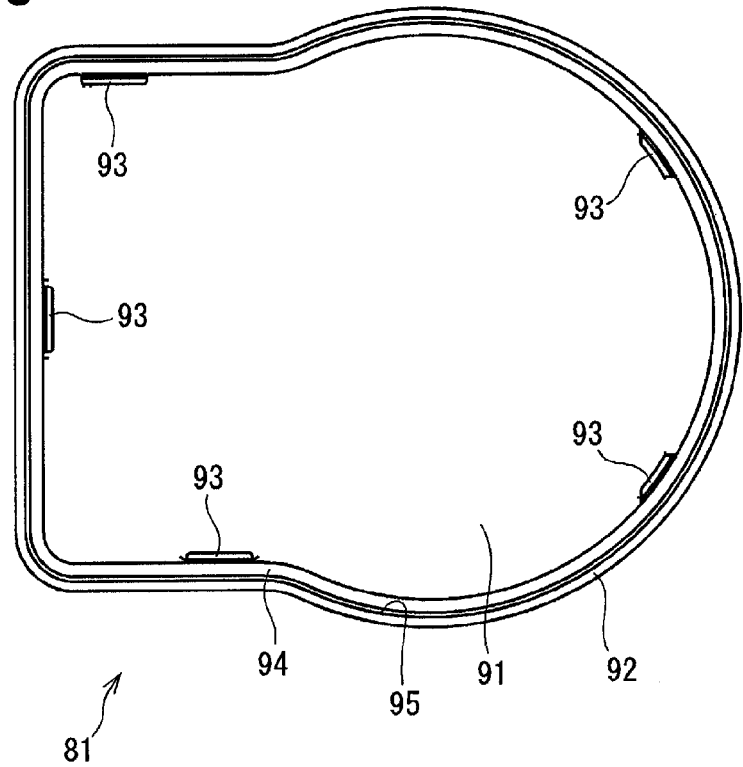
FIG. 6 is a plan view of the cover member according to the first embodiment.

As shown in FIGS. 1 and 5-7, the cover member 81 is placed at the opposite side of the drive apparatus 1, which is axially opposite from the motor 10, and the cover member 81 is fixed to the connector case 61. FIGS. 5 and 6 indicate a side of the cover member 81, which is opposed to the connector case 61.

The cover member 81 includes a cover main body 91, the inserting portion 92 and positioning portions 93.

The cover main body 91 is configured into a tubular form having a bottom. The cover main body 91 axially opens on the motor 10 side and covers the control unit 30.

The inserting portion 92 axially projects from the cover main body 91 on the motor 10 side of the cover main body 91 toward the base side. The inserting portion 92 is continuously formed all around along the entire circumferential extent of the cover main body 91 on the radially outer side of the cover main body 91. The inserting portion 92 is inserted into the seal groove 75 of the connector case 61. Thereby, the seal material 59, which is placed between the inserting portion 92 and the seal groove 75, seals between the connector case 61 and the cover member 81. In this way, intrusion of, for example, water into the receiving space 55 is limited.

The positioning portions 93 axially project from the cover main body 91 toward the base side on the side (the radially inner side in the present embodiment) of the inserting portion 92 where the receiving space 55 is placed. In the present embodiment, the number of the positioning portions 93 is five, and these five positioning portions 93 are circumferentially spaced from each other and are formed at five circumferential locations, respectively, which are spaced from each other in the circumferential direction. With reference to FIG. 7, a distal end of each of the positioning portions 93 in the axial direction is a positioning end part 931, and a distal end of the inserting portion 92 in the axial direction is an inserting end part 921. The positioning end part 931 is axially placed on the motor 10 side of the inserting end part 921. In other words, the positioning end part 931 is displaced from the inserting end part 921 on the base side by a height difference (or simply referred to as a height) d2. A radially outer side of the positioning end part 931 is cut to form a tapered surface 932.

Furthermore, the positioning portion 93 has a positioning surface 935, which is a surface of the positioning portion 93 radially located on the side where the inserting portion 92 is placed. The positioning surface 935 axially extends and is configured to be contactable with an inner peripheral surface 701 of the connector case 61. More specifically, the positioning surface 935 contacts the inner peripheral surface 701 of the connector case 61 when the cover member 81 and the connector case 61 are assembled together.

The cover member 81 includes a contact portion 94, which is formed at a location (radial location) between the inserting portion 92 and the positioning portions 93. The contact portion 94 contacts the distal end 761 of the inner wall portion 76 of the connector case 61. A liquid reservoir groove 95 is formed in the cover member 81 on the top side of the contact portion 94 at a location (radial location) between the contact portion 94 and the inserting portion 92.

Figure 8:
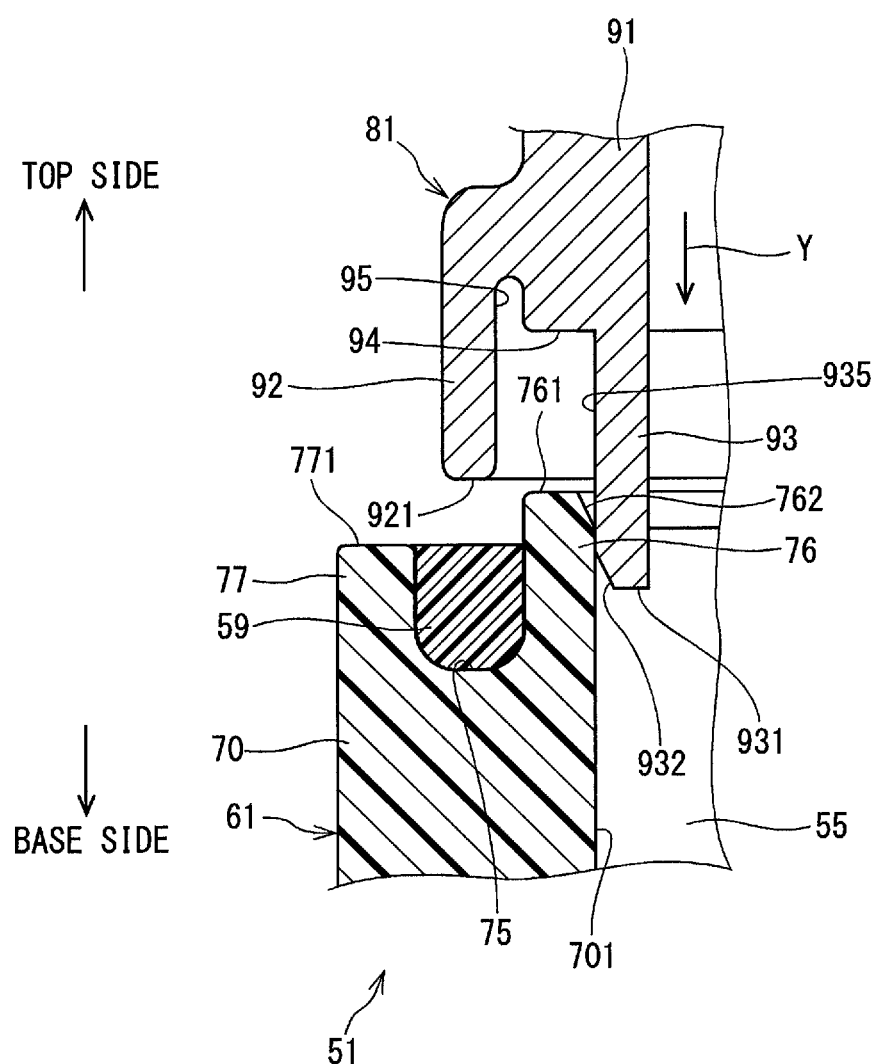
FIG. 8 is a descriptive view for describing assembling of the connector case and the cover member according to the first embodiment.

Now, an assembling procedure for assembling the connector case 61 and the cover member 81 together will be described with reference to FIGS. 7 and 8. In the present embodiment, as indicated by an arrow Y in FIG. 8, the cover member 81 is inserted relative to the connector case 61 from the top side to the base side to assemble the connector case 61 and the cover member 81 together.

In the present embodiment, the positioning portions 93 and the inserting portion 92 are formed such that the positioning end part 931 is placed on the base side of the inserting end part 921. Therefore, when the cover member 81 is assembled to the connector case 61, the positioning portions 93 contact the connector case 61 before the time of contacting the inserting portion 92 to the connector case 61. Specifically, the inner peripheral surface 701 of the connector case 61 contacts the positioning surfaces 935 of the positioning portions 93. In this way, the connector case 61 and the cover member 81 can be appropriately positioned relative to each other. Furthermore, the tapered surface 762 is formed at the radially inner side of the inner wall portion 76 of the connector case 61, and the tapered surface 932 is formed at the radially outer side of each positioning portion 93. Therefore, the assembling is eased by these tapered surfaces 762, 932.

Furthermore, at the time of inserting the inserting portion 92 into the seal groove 75, the seal material 59, which is filled in the seal groove 75, may possibly spill from the seal groove 75. In the present embodiment, the height of the inner wall portion 76 is set to be higher than the height of the outer wall portion 77. Therefore, intrusion of the seal material 59 into the receiving space 55 can be effectively limited with the inner wall portion 76. Furthermore, by positively enabling the spilling of the seal material 59 toward the outer wall portion 77 side by lowering the height of the outer wall portion 77 relative to the height of the inner wall portion 76, the coating state of the seal material 59 can be checked, for instance, with eyes of an inspector from the radially outer side at the time of product inspection. In this way, the product quality can be improved.

Furthermore, in the present embodiment, the liquid reservoir groove 95 is formed. Therefore, even when the liquid level of the seal material 59 exceeds the contact surface between the distal end 761 of the inner wall portion 76 and the contact portion 94, the seal material 59 is released into the liquid reservoir groove 95. Therefore, the intrusion of the seal material 59 into the receiving space 55 can be further limited.

As described above in detail, the receiving member 51 includes the connector case 61 and the cover member 81.

The connector case 61 includes the peripheral wall portion 70. The seal groove 75, which is filled with the seal material 59, is formed in the peripheral wall portion 70. Furthermore, the receiving space 55, which receives the control unit 30, is formed in the inside of the connector case 61.

The cover member 81 includes the cover main body 91, the inserting portion 92 and the positioning portions 93. The cover main body 91 is formed to cover the control unit 30. The inserting portion 92 projects from the cover main body 91 toward the connector case 61 and is inserted into the seal groove 75. The positioning portions 93 project from the cover main body 91 toward the connector case 61 on the side (radially inner side) of the inserting portion 92 where the receiving space 55 is placed. Each positioning portion 93 has the positioning surface 935 that is located on the side (radially outer side) where the inserting portion 92 is placed, and the positioning surface 935 of the positioning portion 93 contacts the inner peripheral surface 701 of the peripheral wall portion 70 located on the side (radially inner side) where the receiving space 55 is placed.

In the present embodiment, the inserting portion 92 and the positioning portions 93 project in the common direction (common axial direction). In this way, the size measured along the inserting direction can be reduced. Furthermore, the positioning surface 935 of the positioning portion 93 and the inner peripheral surface 701 of the peripheral wall portion 70 are used for the positioning between the cover member 81 and the connector case 61. Thereby, the radial size can be reduced in comparison to a case where a dedicated configuration or a dedicated member for receiving the positioning portions 93 is provided separately.

In the present embodiment, the one side, at which the cover member 81 is placed along the inserting direction of the inserting portion 92 relative to the seal groove 75, is defined as the top side. Furthermore, the other side, at which the connector case 61 is placed along the inserting direction of the inserting portion 92 relative to the seal groove 75, is defined as the base side.

The distal end 761 of the inner wall portion 76 is placed on the top side of the distal end 771 of the outer wall portion 77, which is the wall portion of the seal groove 75 that is placed on the side (radial side) opposite from the receiving space 55. In this way, the intrusion of the seal material 59 into the receiving space 55 at the time of inserting the inserting portion 92 into the seal groove 75 can be limited. Thus, the control unit 30, which is received in the receiving space 55, can be protected.

Furthermore, the positioning end part 931, which is the distal end of the positioning portion 93, is placed on the base side of the inserting end part 921, which is the distal end of the inserting portion 92. Thereby, at the time of assembling the connector case 61 and the cover member 81 together, the positioning portion 93 contacts the peripheral wall portion 70 before the time of contacting the inserting portion 92 to the peripheral wall portion 70. Therefore, the connector case 61 and the cover member 81 can be appropriately positioned relative to each other.

The liquid reservoir groove 95 is formed in the cover member 81 on the top side of the contact portion 94 at the location (radial location) between the contact portion 94 and the inserting portion 92. Thereby, the intrusion of the seal material 59 to the receiving space 55 can be further limited.

Furthermore, the drive apparatus 1 includes the receiving member 51, the control unit 30 and the motor 10. The control unit 30 includes the electronic components, which are involved in the control operation of the motor 10. In the present embodiment, the control unit 30 is received in the receiving member 51, so that intrusion of the seal material 59 toward the control unit 30 side can be limited.

Furthermore, in the present embodiment, the connector case 61 is formed integrally with the first connector 65 and the second connector 67, which are used to electrically connect to the external devices. When the component, which is involved in the receiving of the control unit 30, is formed integrally with the connectors 65, 67, the number of the components can be reduced.

Second Embodiment

Figure 9:
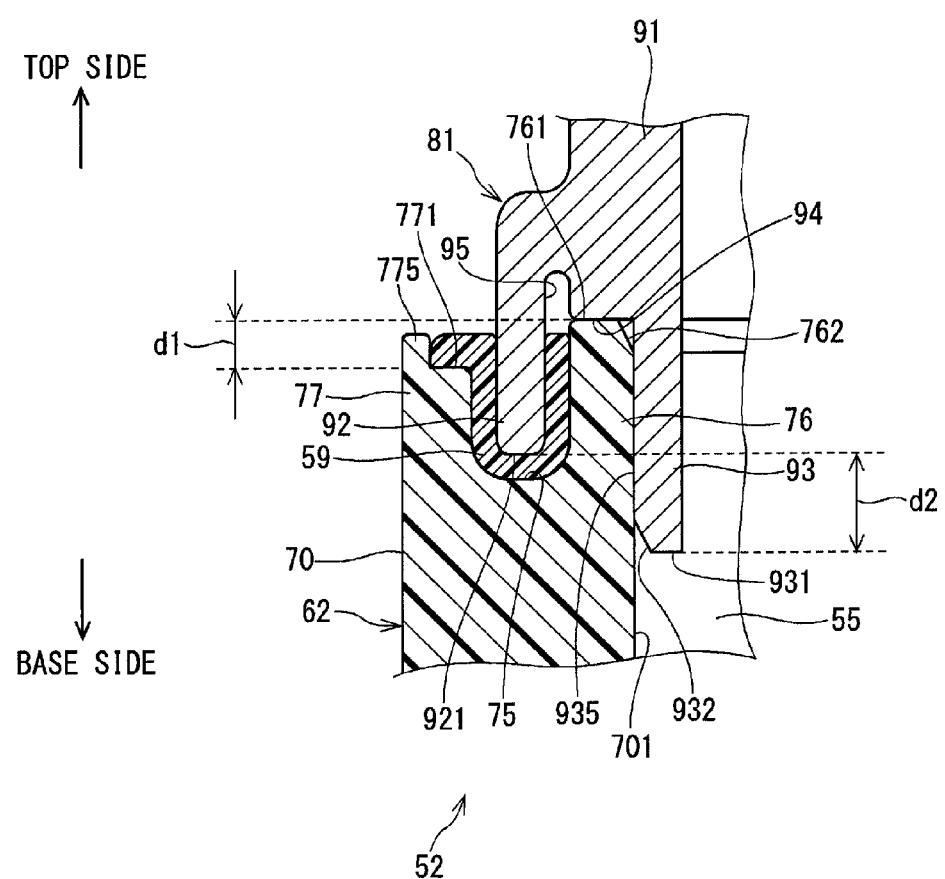
FIG. 9 is a cross-sectional view of a receiving member according to a second embodiment of the present disclosure.

A second embodiment of the present disclosure will be described with reference to FIG. 9. FIG. 9 is a drawing that corresponds to FIG. 7 of the first embodiment. Also, FIGS. 10 and 13 described later are drawings that correspond to FIG. 7 of the first embodiment.

A receiving member 52 of the present embodiment includes a connector case 62 and a cover member 81. The connector case 62 is similar to the connector case 61 of the above embodiment except that an outflow limiting wall 775 is formed in the connector case 62.

The outflow limiting wall 775 axially projects at the distal end 771 side (the top side) of the outer wall portion 77 and is spaced from the seal groove 75 toward the radially outer side. In the present embodiment, the outflow limiting wall 775 circumferentially extends along an outer peripheral part (an outer peripheral edge) of the outer wall portion 77. In this way, outflow of the seal material 59 toward the radially outer side of the peripheral wall portion 70 of the connector case 61 can be limited.

Furthermore, the advantages, which are similar to those discussed in the above embodiment, can be achieved.

Third Embodiment

Figure 10:
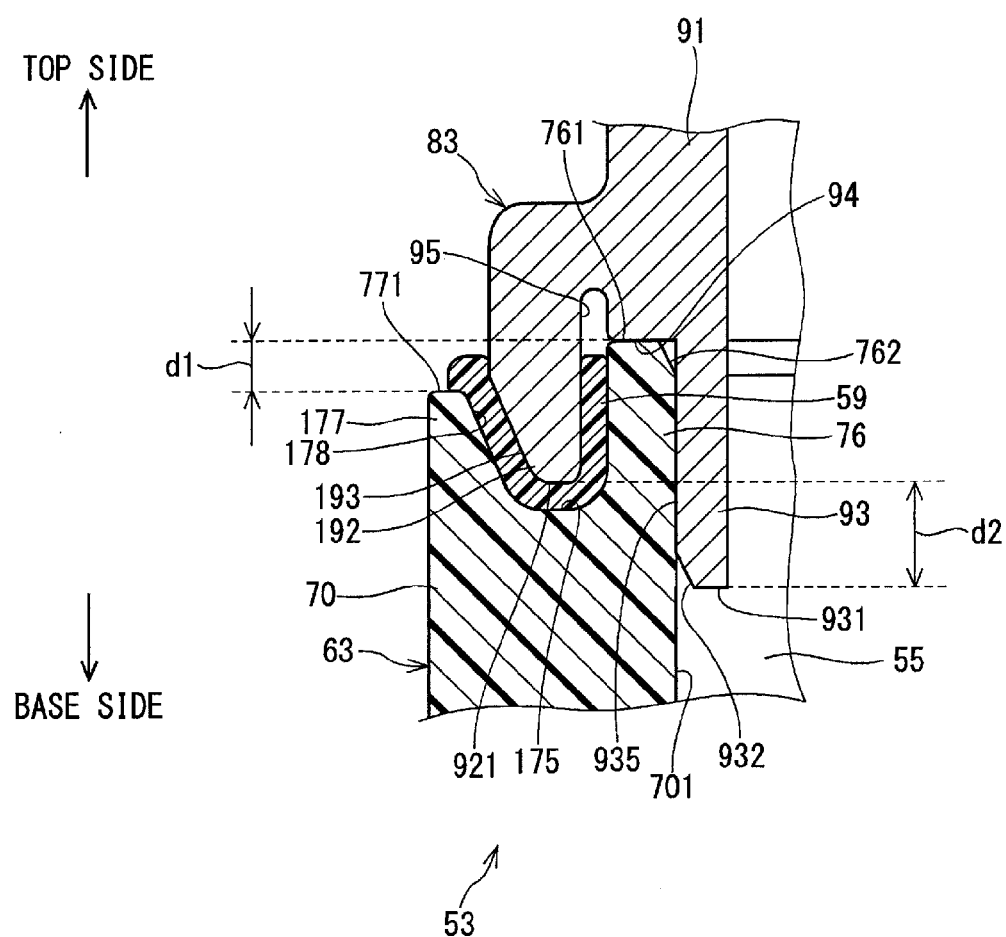
FIG. 10 is a cross-sectional view of a receiving member according to a third embodiment of the present disclosure.

A third embodiment of the present disclosure will be described with reference to FIG. 10.

A receiving member 53 of the present embodiment includes a connector case 63 and a cover member 83. In the present embodiment, the shapes of the outer wall portion 177 and the seal groove 175 of the connector case 63 and the shape of the inserting portion 192 of the cover member 83 differ from those of the above embodiment(s). Other parts are the same as those of the above embodiment(s).

In the connector case 63 of the present embodiment, an inner surface 178 of the outer wall portion 177, which is located on the side where the seal groove 175 is placed, is tapered such that a distance (radial distance) between the inner wall portion 76 and the inner surface 178 of the outer wall portion 177 is progressively increased toward the top side.

Furthermore, an outer surface 193 of the inserting portion 192, which is a surface located on the side where the outer wall portion 177 is placed, is tapered such that a distance (radial distance) between the inner wall portion 76 and the outer surface 193 is progressively reduced toward the inserting end part 921.

The inner surface 178 and the outer surface 193 are generally parallel to each other.

As discussed above, the inner surface 178 and the outer surface 193 are tapered in the state where the inserting portion 192 is inserted into the seal groove 175. Thereby, the guiding of the seal material 59 toward the opposite side (radially outer side), which is opposite from the receiving space 55, can be promoted.

Furthermore, the advantages, which are similar to those discussed in the above embodiment(s), can be achieved.

Fourth Embodiment

Figure 11:
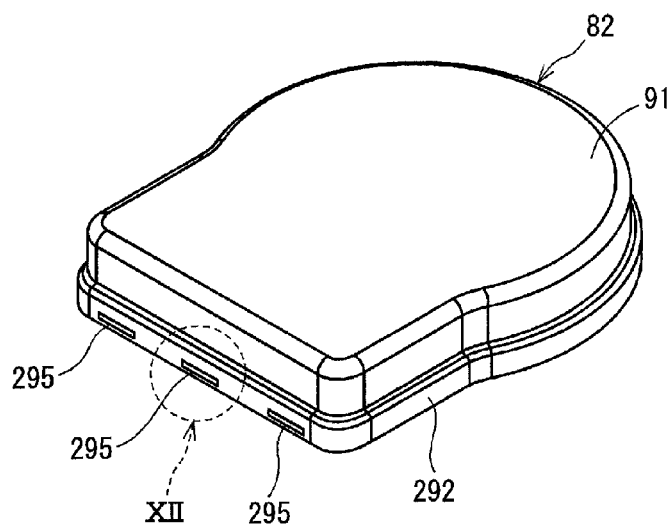
FIG. 11 is a perspective view of a cover member according to a fourth embodiment of the present disclosure.
Figure 12:
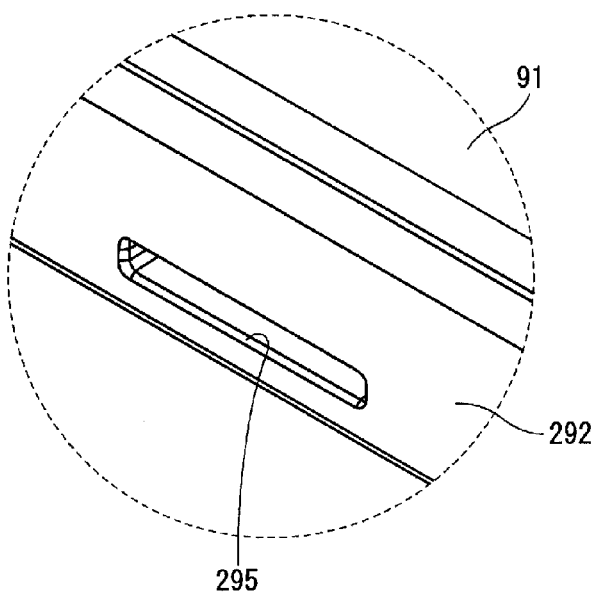
FIG. 12 is a partial enlarged view of an area XII in FIG. 11.

A fourth embodiment of the present disclosure will be described with reference to FIGS. 11, 12 and 13.

A receiving member 54 of the present embodiment includes the connector case 61 and a cover member 82.

Slits 295, which serve as at least one inflow portion of the present disclosure, are formed in an inserting portion 292 of the cover member 82. Each slit 295 extends through the inner wall portion 76 side and the outer wall portion 77 side in the inserting portion 292. The slits 295 of the present embodiment are formed to extend (elongate) in the circumferential direction. However, the shape of the respective slit 295 can be any appropriate shape.

Figure 13:
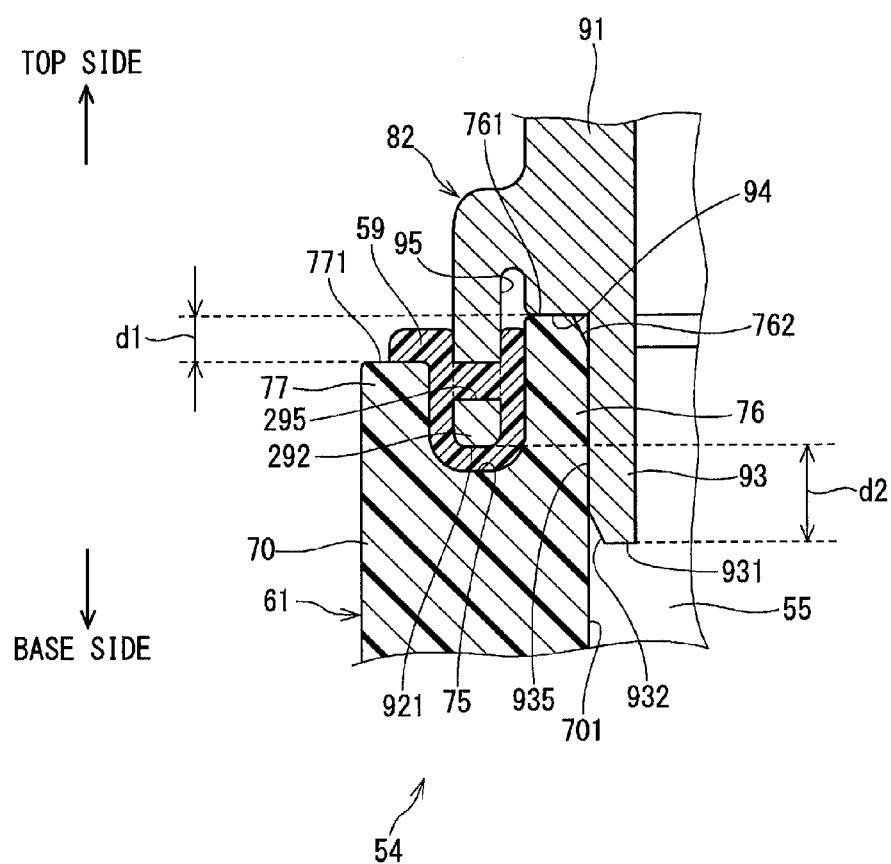
FIG. 13 is a cross-sectional view of a receiving member according to a fourth embodiment of the present disclosure.

As shown in FIG. 13, when the inserting portion 292 is inserted into the seal groove 75, the seal material 59 flows into, i.e., is inputted into the slits 295 from the inner wall portion 76 side and the outer wall portion 77 side to provide an anchoring effect for anchoring the inserting portion 292 of the cover member 82 relative to the seal groove 75. Thereby, removal limiting strength for limiting the removal of the inserting portion 292 can be improved.

Furthermore, the advantages, which are similar to those discussed in the above embodiment(s), can be achieved.

Fifth Embodiment

Figure 14:
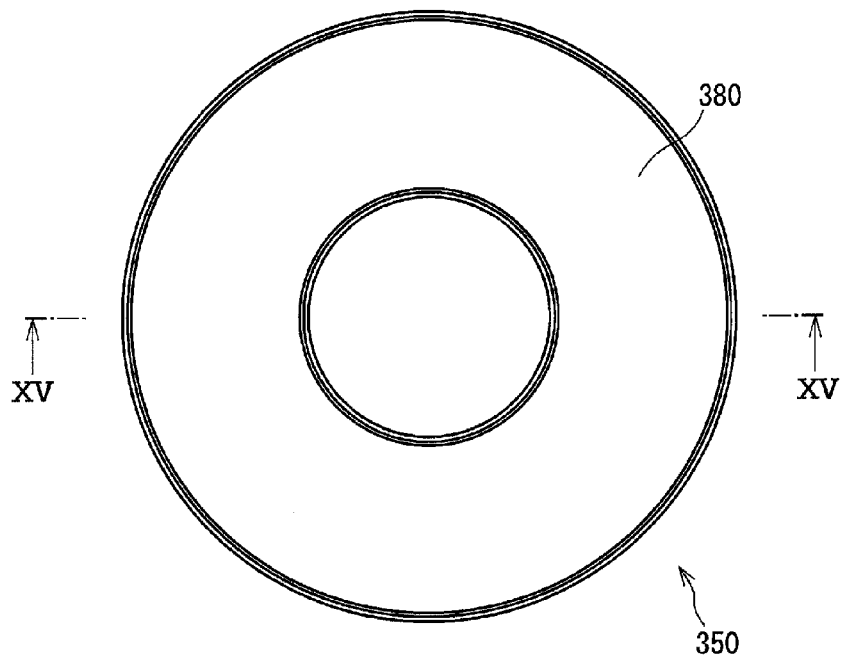
FIG. 14 is a plan view of a receiving member according to a fifth embodiment of the present disclosure.
Figure 15:
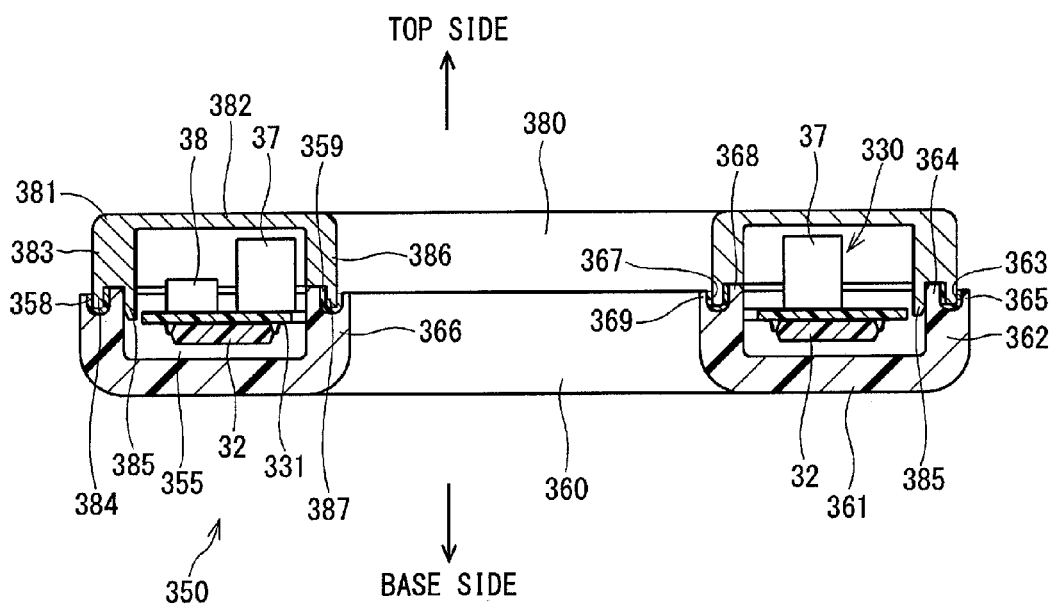
FIG. 15 is a cross sectional view taken along line XV-XV in FIG. 14.

A fifth embodiment of the present disclosure will be described with reference to FIGS. 14 and 15. In FIGS. 14 and 15, other members and electrical wirings connected to a control unit 330 are omitted for the sake of simplicity.

A receiving member 350 of the present embodiment includes a case member 360 and a cover member 380 and is configured into a generally annular form in a plan view of the receiving member 350. A receiving space 355, which is formed in an inside of the receiving member 350, receives the control unit (serving as a protection-subject component) 330. In the present embodiment, one side, at which the cover member 380 is placed along an inserting direction of inserting portions 384, 387 relative to seal grooves 363, 367, is defined as a top side. Furthermore, another side, at which the case member 360 is placed along the inserting direction of the inserting portions 384, 387 relative to the seal grooves 363, 367, is defined as a base side.

The control unit 330 includes a circuit board 331, the control electronic components 32, and the capacitors 37, 38 and is fixed to the case member 360 with, for example, fixing members (not shown). The circuit board 331 is configured into a generally annular form, and the electronic components, such as the control electronic components 32 and the capacitors 37, 38, are mounted to the circuit board 331.

The case member 360 is configured into an annular form and includes a bottom portion 361, a first peripheral wall portion 362 and a second peripheral wall portion 366. The first peripheral wall portion 362 is formed on the radially outer side. The second peripheral wall portion 366 is formed on the radially inner side. The receiving space 355 is formed in the inside of the case member 360.

The seal groove 363 is formed at the top side of the first peripheral wall portion 362. The seal groove 363 opens on the top side and is continuously formed all around along the entire circumferential extent of the first peripheral wall portion 362. A seal material 358, such as the silicone bonding agent, is filled into the seal groove 363.

In the first peripheral wall portion 362, a wall portion of the seal groove 363, which is located on a side (radial side) where the receiving space 355 is placed, is an inner wall portion 364. Furthermore, a wall portion of the seal groove 363, which is located on an opposite side (radial side) that is opposite from the receiving space 355, is an outer wall portion 365. A height of the inner wall portion 364 is set to be higher than a height of the outer wall portion 365 in the axial direction. That is, the distal end of the inner wall portion 364 is placed on the top side of the distal end of the outer wall portion 365.

The seal groove 367 is formed at the top side of the second peripheral wall portion 366. The seal groove 367 opens on the top side and is continuously formed all around along the entire circumferential extent of the second peripheral wall portion 366. The seal material 359, which is similar to the seal material 358 of the seal groove 363, is filled in the seal groove 367.

In the second peripheral wall portion 366, a wall portion of the seal groove 367, which is located on a side (radial side) where the receiving space 355 is placed, is an inner wall portion 368. Furthermore, a wall portion of the seal groove 367, which is located on an opposite side (radial side) that is opposite from the receiving space 355, is an outer wall portion 369. A height of the inner wall portion 368 is set to be higher than a height of the outer wall portion 369 in the axial direction. That is, the distal end of the inner wall portion 368 is placed on the top side of the distal end of the outer wall portion 369.

In the present embodiment, the inner wall portions 364, 368 are formed to have the corresponding identical height, and the outer wall portions 365, 369 are formed to have the corresponding identical height. However, depending on the shape of the cover member 380, the inner wall portions 364, 368 may have different heights, respectively, and the outer wall portions 365, 369 may have different heights, respectively.

In the present embodiment, the first peripheral wall portion 362 and the second peripheral wall portion 366 serve as peripheral wall portions of the present disclosure.

The cover member 380 includes a cover main body 381, the inserting portions 384, 387 and the positioning portions 385.

The cover main body 381 is configured into an annular form and includes a top portion 382, a first cover wall portion 383 and a second cover wall portion 386. The first cover wall portion 383 is formed on the radially outer side of the top portion 382. The second cover wall portion 386 is formed on the radially inner side of the top portion 382.

In the first cover wall portion 383, the inserting portion 384 and the positioning portions 385 axially project on an opposite side, which is opposite from the top portion 382, i.e., on the base side. The inserting portion 384 is continuously formed all around along the entire circumferential extent of the first cover wall portion 383 at the radially outer side (outer peripheral edge) of the first cover wall portion 383 and is inserted into the seal groove 363.

The positioning portions 385 are circumferentially spaced from each other and are respectively formed at the multiple locations along the inner peripheral side (inner peripheral edge) of the first cover wall portion 383. The distal end of each positioning portion 385 is placed on the side of the distal end of the inserting portion 384, which is opposite from the top portion 382. In other words, the distal end of the positioning portion 385 is placed on the base side of the distal end of the inserting portion 384. Furthermore, the surface of the positioning portion 385, which is located on the side where the inserting portion 384 is placed, is configured to be contactable with the inner surface of the first peripheral wall portion 362 of the case member 360.

In the second cover wall portion 386, the inserting portion 387 axially projects on the opposite side, which is opposite from the top portion 382, i.e., on the base side. The inserting portion 387 is continuously formed all around along the entire circumferential extent of the second cover wall portion 386 at the radially inner side (inner peripheral edge) of the second cover wall portion 386 and is inserted into the seal groove 367. In the present embodiment, the location of the distal end of the inserting portion 387 along the inserting direction is generally the same as that of the inserting portion 384. Alternatively, the location of the distal end of the inserting portion 387 along the inserting direction may be different from that of the inserting portion 384 as long as the location of the distal end of the inserting portion 387 is on the top portion side of the distal end of the positioning portion 385.

In the present embodiment, the distal end of the positioning portion 385 is formed to be on the base side of the distal end of the inserting portions 384, 387. Therefore, at the time of assembling the cover member 380 to the case member 360, the positioning portions 385 contact the case member 360 before the time of contacting the inserting portions 384, 387 to the case member 360. In this way, the case member 360 and the cover member 380 can be appropriately positioned relative to each other.

Furthermore, in the first peripheral wall portion 362, the height of the inner wall portion 364 is larger than the height of the outer wall portion 365 in the axial direction. Therefore, intrusion of the seal material 358 into the receiving space 355 can be limited. Furthermore, by positively enabling the spilling of the seal material 358 toward the outer wall portion 365 side, the coating state of the seal material 358 can be checked, for instance, with eyes of the inspector from the radially outer side at the time of product inspection. Thereby, the product quality can be improved.

Similarly, at the second peripheral wall portion 366, the height of the inner wall portion 368 is larger than the height of the outer wall portion 369 in the axial direction. Therefore, intrusion of the seal material 359 into the receiving space 355 can be limited. Furthermore, by positively enabling the spilling of the seal material 359 toward the outer wall portion 369 side, the coating state of the seal material 359 can be checked, for instance, with the eyes of the inspector from the radially inner side at the time of product inspection. Thereby, the product quality can be improved.

Furthermore, even in the case where the receiving member 350 is configured into the annular form, the advantages, which are similar to those discussed in the above embodiment(s), can be achieved.

Other Embodiments

At least a part of any one of the above embodiments may be combined with at least a part of another or more of the above embodiments in an appropriate manner. Specifically, for example, the outflow limiting wall may be formed to project in the outer wall portion, like in the second embodiment, and the inner surface of the outer wall portion may be tapered like in the third embodiment.

Furthermore, in the inserting portion, which is tapered like in the third embodiment, the inflow portion(s), into which the seal material flows, may be formed like in the fourth embodiment. In the third embodiment, the inner surface of the outer wall portion and the outer surface of the inserting portion are tapered. In another embodiment, the inner surface of the outer wall portion may be tapered, and the outer surface of the inserting portion may not be tapered.

Furthermore, like in the fifth embodiment, in the receiving member, which is configured into the annular form, the liquid reservoir groove may be formed like in the first to fourth embodiments, or the outflow limiting wall may be formed like in the second embodiment. Furthermore, like in the third embodiment, at least one of the outer wall portion and the inserting portion may be tapered, and like in the fourth embodiment, the inflow portion(s), into which the seal material flows, may be formed in the inserting portion.

Furthermore, the shape of the receiving member is not limited the above embodiment(s) and may be changed to any shape.

Furthermore, in the fifth embodiment, the positioning portions are formed in the first cover wall portion. In another embodiment, the positioning portions may be formed in the second cover wall portion or may be formed in both of the first cover wall portion and the second cover wall portion.

Furthermore, in the above embodiments, the positioning portions are circumferentially spaced from each other and are respectively formed at the multiple locations (for example, the five locations in the first embodiment). In another embodiment, the number of the positioning portions, which are circumferentially spaced from each other, is not limited to five and may be changed to any number. Furthermore, the positioning portion may be formed to extend all around along the entire circumferential extent of corresponding wall portion.

In the above embodiments, each of the seal groove and the inserting portion is continuously formed all around along the entire circumferential extent of the corresponding wall portion. Although it is desirable that each of the seal groove and the inserting portion is continuously formed all around along the entire circumferential extent of the corresponding wall portion, one or both of the seal groove and the inserting portion may be discontinuously formed by, for example, cutting a portion(s) of the one or both of the seal groove and the inserting portion.

In the fourth embodiment, the inflow portions formed in the inserting portion are the slits, each of which radially extends between the inner wall portion side and the outer wall portion side of the inserting portion. In another embodiment, the inflow portions may be recesses, which are formed in at least one of the inner wall portion side and the outer wall portion side of the inserting portion. Furthermore, in place of the recesses, protrusions may be formed in at least one of the inner wall portion side and the outer wall portion side of the inserting portion. In such a case, for example, a distal end side of each projection at the inserting portion may serve as an inflow portion of the present disclosure. Even with this construction, it is possible to provide the anchoring effect for anchoring the inserting portion relative to the seal groove. Thereby, the removal limiting strength for limiting the removal of the inserting portion can be improved.

In the above embodiments, the case member is the connector case that is formed integrally with the connector. In another embodiment, the case member is not limited to the connector case and may be any member as long as a protection-subject component can be placed in the inside of the case member. In the above embodiments, the connector case is configured into a tubular form, and an opposite side of the connector case, which is opposite from the cover member, is closed with the rear frame end. In another embodiment, the case member may be configured into a tubular form, which has a bottom and opens only on the cover member side.

In the above embodiments, the protection-subject component is the control unit. In another embodiment, the protection-subject component can be any component as long as the component can be received in the receiving space.

In the above embodiments, the receiving member is applied to the drive apparatus that has the control unit at the axial side in the axial direction of the motor. In another embodiment, the receiving member may be applied to an apparatus that is other than the drive apparatus. The electrical rotating machine of the above embodiments is the three-phase AC motor and has the two sets of the three-phase windings. In another embodiment, the electrical rotating machine may be any type, and the number of the winding sets may be any number.

Furthermore, in the above embodiments, the drive apparatus is used in the electric power steering apparatus. In another embodiment, the drive apparatus may be applied to any other apparatus that is other than the electric power steering apparatus.

The present disclosure is not limited to the above embodiments and modifications thereof. That is, the above embodiments and modifications thereof may be modified in various ways without departing from the spirit and scope of the present disclosure.

What is claimed is:

1. A receiving member comprising:
   a case member that includes a peripheral wall portion, wherein a seal groove, which is filled with a seal material, is formed in the peripheral wall portion, and a receiving space, which receives a protection-subject component, is formed in an inside of the case member; and
   a cover member that includes:
   a cover main body, which covers the protection-subject component;
   an inserting portion, which projects from the cover main body toward the case member and is inserted into the seal groove; and
   a positioning portion, which projects from the cover main body toward the case member and is located on a side of the inserting portion where the receiving space is placed, wherein the positioning portion has a surface that is located on a side where the inserting portion is placed, and the surface of the positioning portion contacts a surface of the peripheral wall portion located on a side where the receiving space is placed, wherein:
   one side, at which the cover member is placed along an inserting direction of the inserting portion relative to the seal groove, is defined as a top side;
   another side, at which the case member is placed along the inserting direction, is defined as a base side;
   a wall portion of the seal groove, which is located on a side where the receiving space is placed, is an inner wall portion;
   a wall portion of the seal groove, which is located on an opposite side that is opposite from the receiving space, is an outer wall portion;
   a distal end of the inner wall portion is placed on the top side of a distal end of the outer wall portion; and
   a distal end of the positioning portion is placed on the base side of a distal end of the inserting portion, wherein:
   the cover member includes a contact portion that is located on the top side of the distal end of the inner wall portion and contacts the distal end of the inner wall portion; and
   a liquid reservoir groove is formed in the cover member on the top side of the contact portion at a location between the contact portion and the inserting portion in a state where the contact portion contacts the distal end of the inner wall portion.

2. The receiving member according to claim 1, wherein the outer wall portion has an outflow limiting wall, which projects on the top side of the outer wall portion and is spaced from the seal groove.

3. The receiving member according to claim 1, wherein a surface of the outer wall portion, which is located on a side where the seal groove is placed, is tapered such that a distance between the inner wall portion and the surface of the outer wall portion is progressively increased toward the top side.

4. The receiving member according to claim 1, wherein the inserting portion has an inflow portion, into which the seal material is inputted from at least one of:
   a side where the inner wall portion is placed; and
   a side where the outer wall portion is placed.

5. A drive apparatus comprising:
   the receiving member according to claim 1;
   the protection-subject component; and
   an electrical rotating machine, wherein the protection-subject component is a control unit that includes an electronic component that is involved in a control operation of the electrical rotating machine.

6. The drive apparatus according to claim 5, wherein the case member is formed integrally with a connector, which is used to connect the drive apparatus to an external device.

* * * * *